United States Patent [19]

Gay et al.

[11] 4,042,801
[45] Aug. 16, 1977

[54] ELECTRON BEAM APPARATUS

[75] Inventors: Cecil Arthur Joseph Gay; Leslie George Henry Rockey, both of Bristol, England

[73] Assignee: British Aircraft Corporation Limited, London, England

[21] Appl. No.: 605,882

[22] Filed: Aug. 19, 1975

[30] Foreign Application Priority Data

Aug. 31, 1974 United Kingdom .............. 38163/74
Aug. 31, 1974 United Kingdom .............. 38164/74

[51] Int. Cl.² .............................................. B23K 9/00
[52] U.S. Cl. .............................................. 219/121 EB
[58] Field of Search ............... 219/121 EB, 121 EM, 219/123; 335/210, 213; 313/421, 423, 433, 434, 439, 440, 153, 156; 315/372, 374, 382, 383, 395, 399; 328/230; 250/492 R

[56] References Cited

U.S. PATENT DOCUMENTS

| | | | |
|---|---|---|---|
| 2,882,446 | 4/1959 | Janssen et al. | 335/210 X |
| 3,131,289 | 4/1964 | Hansen | 219/121 EB |
| 3,169,207 | 2/1965 | Obert et al. | 335/210 X |
| 3,221,133 | 11/1965 | Kazato et al. | 219/121 EB X |
| 3,389,252 | 6/1968 | Poole | 219/121 EB X |
| 3,479,483 | 11/1969 | Boring et al. | 219/121 EB |
| 3,854,108 | 12/1974 | Horie et al. | 335/210 |

Primary Examiner—J. V. Truhe
Assistant Examiner—Fred E. Bell
Attorney, Agent, or Firm—Cushman, Darby & Cushman

[57] ABSTRACT

In order to provide exceptionally high beam deflection speed in apparatus utilizing a magnetically deflected electron beam, such as an electron microscope or an electron beam welding machine, a ferro-magnetic yoke having opposed internal poles arranged to be positioned on opposite sides of the beam is provided with a pair of beam deflection coils on each pole, one coil of each pair being connected in a series circuit including a coil of the other pair and in a sense such that the voltage induced in one pair of coils by a collapsing deflection current in the other pair assists the rising deflection current in the first mentioned pair.

In the case of a welding machine the apparatus includes generating means for applying to each series circuit alternately a voltage having a waveform such that the beam may be deflected alternately between two welding positions spaced transversely relative to the direction of movement of the workpiece and at a speed such that there is no substantial melting of the workpiece during the transverse movement of the beam.

5 Claims, 6 Drawing Figures

ELECTRON BEAM APPARATUS

This invention relates to electron beam deflecting apparatus and more particularly to electron beam welding machines utilising such apparatus.

One object of the invention is to provide deflecting apparatus having a relatively fast deflection speed. A further object of the invention is to provide an electron beam welding machine enabling two parallel weld runs to be carried out simultaneously.

According to one aspect of the invention beam deflecting apparatus comprises a ferro-magnetic yoke having opposed internal poles arranged to be positioned on opposite sides of the electron beam, and a pair of beam deflection coils on each pole, one coil of each pair being connected in a series circuit including a coil of the other pair and in a sense such that the voltage induced in one pair of coils by a collapsing deflection current in the other pair assists the rising deflection current in the first mentioned pair.

According to another aspect of the invention electron beam welding apparatus includes, in combination, a housing and, within the housing, an electron gun, means for traversing a workpiece within the housing relative to the beam from the gun, and beam deflecting means comprising a ferro-magnetic yoke having opposed internal poles arranged to be positioned on opposite sides of the electron beam, and a pair of beam deflection coils on each pole, one coil of each pair being connected in a series circuit including a coil of the other pair and in a sense such that the voltage induced in one pair of coils by a collapsing deflection current in the other pair assists the rising deflection current in the first mentioned pair.

Further features of the invention will appear from the following description with reference to the accompanying drawings where FIG. 1 shows a preferred form of electron beam welding apparatus according to the invention, whilst FIGS. 2 and 3 show respectively the deflecting coil assembly and the deflection control circuit.

Figure 1:
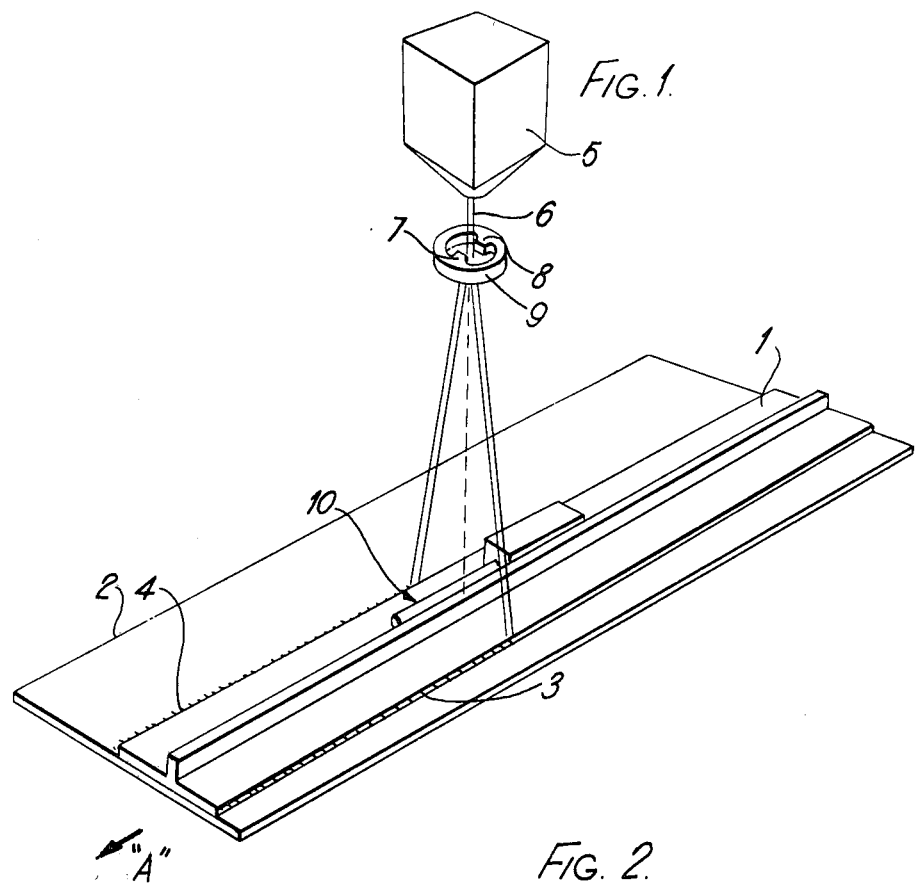

Referring now to FIG. 1 the welding machine is shown welding a stiffening member 1 to a plate 2 by means of two parallel continuous weld runs 3 and 4 and includes an electron gun 5 arranged to produce in known manner an electron beam 6.

Figure 3:
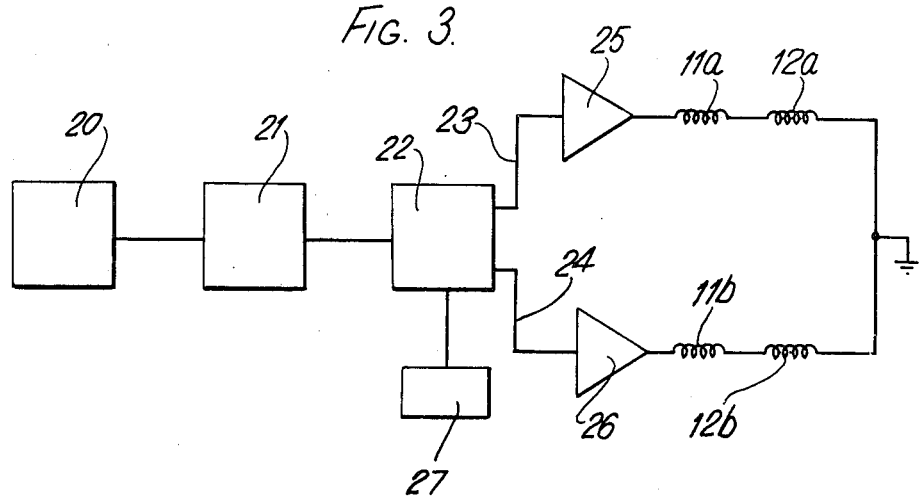

The beam 6 passes between poles 7 and 8 of a toroidal ferro-magnetic yoke 9, deflection coils (not shown) on the yoke being energised from the control circuit shown in FIG. 3 so as to switch the beam alternately between the two welding runs. A sensing device 10, the purpose of which will be described later, is positioned to one side of the undeflected beam position. The stiffening member 1 and plate 2 are clamped to a work table (not shown) arranged for movement in the direction of the arrow A, the whole assembly being mounted within an evacuated housing, also not shown.

Figure 2:
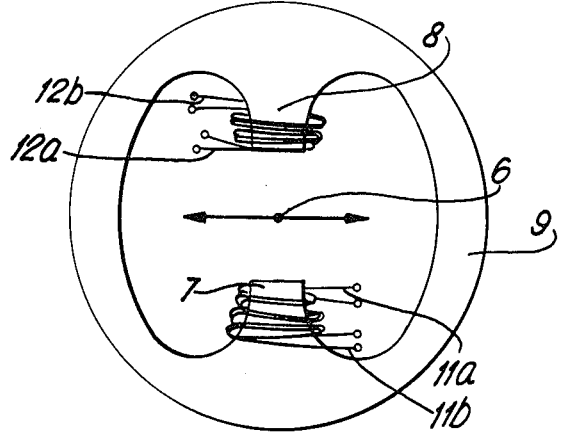

As will be seen from FIG. 2 each pole 7, 8 of the toroidal yoke 9 has mounted thereon a bifilar deflecting coil 11a, 11b and 12a, 12b respectively.

For the two weld runs 3 and 4 to be continuous two advancing weld pools must be maintained as the worktable moves relative to the gun and the electron beam must be switched between the two weld runs sufficiently quickly to avoid melting of the stiffener 1 during the transverse movement of the beam.

This is achieved by the deflection circuit shown in FIG. 3 and which comprises a square wave generator 20 the output voltage of which is taken via a "divide by two" circuit 21 and used as the basic deflection control voltage.

The frequency of the square wave voltage determines the repetition rate of the beam switching whilst the "divide by two" circuit, which is always triggered by the same edge of the square wave, provides an even mark to space ratio ensuring that the beam impinges on the two welds for equal lengths of time.

The deflection control voltage is fed to a combined buffer amplifier and reference control circuit 22 which produces two output voltages in the lines 23 and 24 in anti-phase. These voltages control power amplifiers 25 and 26 respectively, which supply energising currents to the deflection coil sections 11a, 12a in series and 11b, 12b in series. The power amplifiers 25 and 26 are arranged to operate in a constant current mode so as to obtain the required fast rise-time of the deflection system and also contain highly stable voltage references for accurate control of the required current levels. A programmable variable voltage reference circuit 27 provides for the production of divergent or convergent welds.

Figure 4:
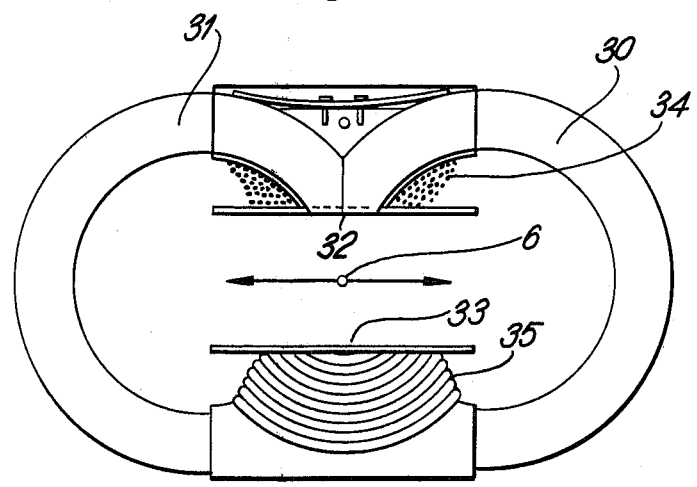
FIG. 4 shows an alternative form of deflecting coil assembly.

The deflection coils are connected so that the voltage induced in the series connected sections 11a, 12a by a collapsing deflecting current in the other two sections 11b, 12b assists the rising deflection currents in the sections 11a, 12a and vice versa. Thus the current induced due to the mutual inductance of the coils speeds up deflection of the beam between the two welding runs enabling the beam to be deflected sufficiently rapidly to ensure that there is no transverse welding of the workpiece. In the alternative deflection coil assembly as shown in FIG. 4 the toroidal yoke comprises two part-toroidal cores 30, 31 arranged to form a magnetic circuit with poles 32, 33. Bifilar deflecting coils 34, 35 are arranged to be energised from the circuit of FIG. 3 in the same way as the coils in FIG. 2. In either arrangement the two deflecting coils may each be formed from a twisted pair of Litz conductors.

Figure 5:
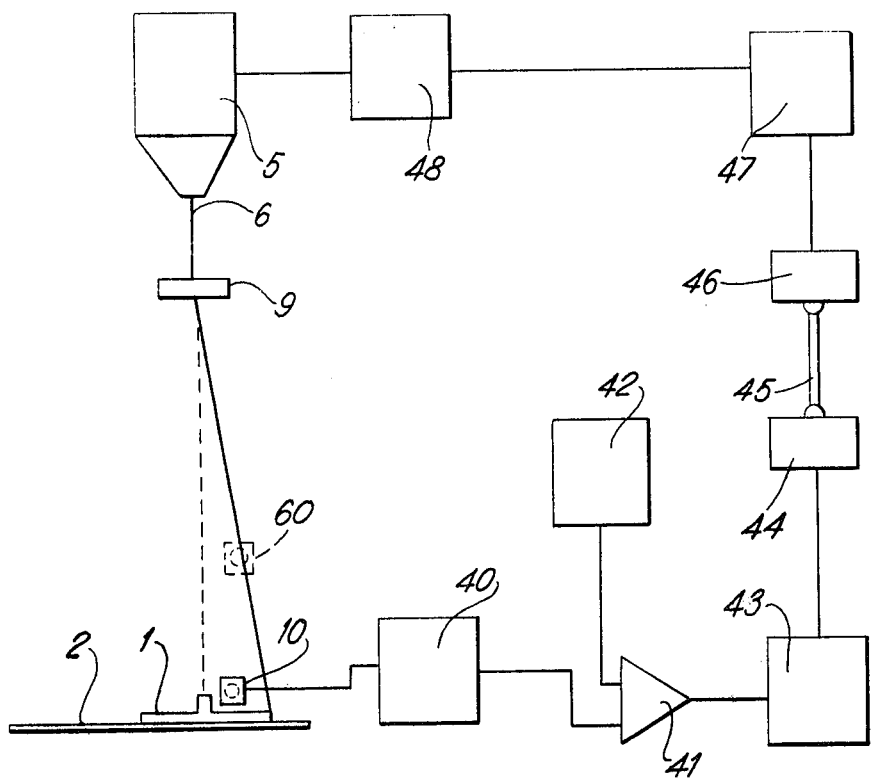
FIG. 5 shows an automatic beam current control circuit whilst

Referring now to FIG. 5 the sensing device 10, which is arranged to produce a pulse signal proportional to the electron beam current each time the beam traverses between the two weld runs, is connected to a combined signal sample and hold current 40. The output from this circuit is applied to a comparator amplifier 41 where it is compared with a reference signal derived from a reference source 42. This reference signal is arranged to be proportional to the desired beam current.

The comparator amplifier produces an error signal dependant on any difference between the actual beam current and the desired beam current which is used to correct the actual beam current.

It will be appreciated that the electron gun 5 is operated at very high negative voltages of the order of 150 Kv whereas the sensing device 10 is virtually at earth potential. This makes a direct electrical link with the beam current control circuit very difficult and the error signal is therefore encoded in an encoder 43 arranged to control a light source 44 so that a frequency modulated stream of light pulses is transmitted through a fibre optic light pipe 45 to a receiver 46. The receiver is connected to a suitable demodulator 47 which reconstructs the error signal which is then applied to a known form of beam current control circuit 48.

Figure 6:
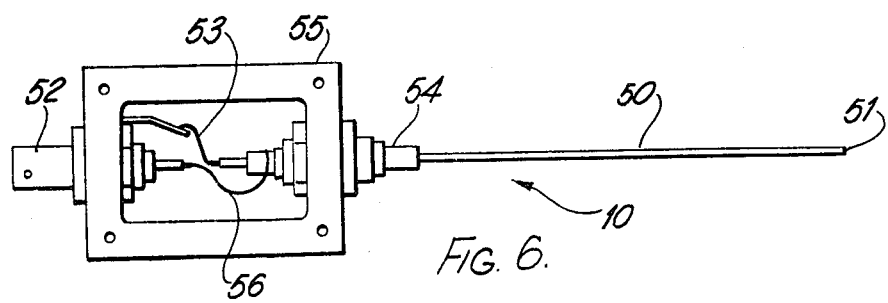
FIG. 6 shows a beam current sensing probe for use in the circuit of FIG. 5.

Referring now to FIG. 6 the sensing device 10 comprises a thin walled tube 50 containing a resistive element (not shown) connected at one end to the outer end 51 of the tube and at the other end to the outer terminal of a co-axial socket 52 via a connecting wire 53. The resistive element is spaced from the tube wall by a glass spacer, also not shown.

The tube 50 is supported by a PTFE bush 54 carried by a housing 55 made from a solid block of aluminium and is connected by means of wire 56 to the centre terminal of the co-axial socket.

In operation, the sensing device is fixed to a suitable extension, not shown, of the structure supporting the workpiece which is at earth potential so that when the beam impinges on the tube 50 it finds earth through the resistive element thereby generating a pulse voltage across the co-axial socket. This pulse voltage is applied to the combined sample and hold circuit 40 shown in FIG. 5.

Automatic focus control of the beam may be obtained by adding a further sensing device 60 shown dotted in FIG. 5, similar to the sensing device 10 and positioned so that the two devices are scanned in sequence as the beam traverses between the two welding runs.

It will be appreciated that the current of the beam is distributed across a generally circular cross-section according to the focus of the beam so that the pulse signals produced by the two sensing devices will have a duration dependant on the diameter of the beam. Thus, by comparing the width of the two pulses in a comparator circuit an error signal may be produced which can be encoded and used to control the focus of the beam via an optical link as described with reference to the control of the beam current.

The current control and the focus control may be combined in such a way that one of the sensing devices is common to both systems and the two encoded error signals may be transmitted over a single optical link in multiplexed form.

Two runs of "stitch" welds, as distinct from continuous welds, may be obtained by reducing the frequency of the square wave output from the generator 20.

We claim:

1. Electron beam welding apparatus including, in combination, an electron gun for generating an electron welding beam, means for traversing a workpiece relative to the beam, an annular ferro-magnetic yoke having diametrically opposed internal poles thereon, a pair of beam deflecting coils on each pole for deflecting the beam transversely relative to the direction of movement of the workpiece, one coil of each pair being connected in series with a coil of the other pair in a sense such that the voltage induced in one pair of series connected coils by a collapsing deflection current in the other pair of series connected coils assists the rising deflection current in the first mentioned pair of series connected coils, and vice versa, and supply means for supplying the two pairs of series connected coils alternately with energizing current of substantially square waveform to deflect the beam alternately between two transversely spaced welding positions.

2. Electron beam welding apparatus according to claim 1, wherein the beam deflection speed is sufficiently high to ensure that no welding of the workpiece occurs during the traversing movement of the beam, and wherein the frequency of the waveform is such as to obtain two continuous runs of welds.

3. Electron beam welding apparatus according to claim 1 wherein the beam deflector speed is sufficiently high to ensure that no welding of the workpiece occurs during the traversing movement of the beam, and wherein the frequency of the waveform is such as to obtain two runs of interrupted welds.

4. Electron beam welding apparatus according to claim 1 including a beam current sensing device positioned so as to be traversed by the beam as the beam is deflected between the two welding positions and to produce a signal dependent on beam current, means for producing a reference signal and comparator means for automatically adjusting the beam current in a corrective sense in accordance with any difference between the two signals.

5. Electron beam welding apparatus according to claim 1 including two beam current sensing devices positioned so as to be traversed by the beam as the beam is deflected between the two welding positions, the two devices being spaced at different distances from the gun so that each produces a signal dependent on the width of the beam at that position, and comparator means for automatically adjusting the focus of the gun in a corrective sense in accordance with any difference between the two signals.

* * * * *